(12) United States Patent
Lee et al.

(10) Patent No.: US 9,663,855 B2
(45) Date of Patent: May 30, 2017

(54) PLASMA-ENHANCED CHEMICAL VAPOR DEPOSITION APPARATUS AND METHOD OF MANUFACTURING DISPLAY APPARATUS USING THE SAME

(71) Applicant: Samsung Display Co., Ltd., Yongin, Gyeonggi-Do (KR)

(72) Inventors: Jung-Sik Lee, Yongin (KR); Myung-Su Heo, Yongin (KR); Seok-Won Jung, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 689 days.

(21) Appl. No.: 14/066,842

(22) Filed: Oct. 30, 2013

(65) Prior Publication Data

US 2015/0024147 A1 Jan. 22, 2015

(30) Foreign Application Priority Data

Jul. 19, 2013 (KR) .................. 10-2013-0085694

(51) Int. Cl.
*H01J 37/32* (2006.01)
*C23C 16/04* (2006.01)
*C23C 16/509* (2006.01)

(52) U.S. Cl.
CPC ........ *C23C 16/042* (2013.01); *C23C 16/5096* (2013.01); *H01J 37/3244* (2013.01); *H01J 37/32091* (2013.01); *H01J 37/32568* (2013.01); *H01J 37/32623* (2013.01)

(58) Field of Classification Search
None
See application file for complete search history.

(56) References Cited

U.S. PATENT DOCUMENTS

| | | | | |
|---|---|---|---|---|
| 4,836,138 | A * | 6/1989 | Robinson | C23C 16/481 118/500 |
| 5,543,890 | A * | 8/1996 | Tanaka | H01L 21/682 355/53 |
| 8,277,889 | B2 * | 10/2012 | Gomi | C23C 16/16 118/504 |
| 2003/0047817 | A1 * | 3/2003 | Kim | C23C 14/243 257/797 |
| 2003/0124764 | A1 * | 7/2003 | Yamazaki | B05D 1/60 438/99 |
| 2009/0078202 | A1 * | 3/2009 | Strikovski | C23C 14/541 118/725 |

(Continued)

FOREIGN PATENT DOCUMENTS

| KR | 1020020050036 A | 6/2002 |
|---|---|---|
| KR | 1020060076987 A | 7/2006 |

(Continued)

*Primary Examiner* — Mandy Louie
(74) *Attorney, Agent, or Firm* — Cantor Colburn LLP

(57) ABSTRACT

A plasma-enhanced chemical vapor deposition ("PECVD") apparatus includes: an ejecting unit which is configured to eject a gas toward a substrate onto which the gas is deposited; a lift which is configured to support and selectively raise or lower a mask unit in which is defined a pattern through which the gas ejected from the ejecting unit passes towards the substrate; and a susceptor into which a portion of the lift is inserted, and which is configured to linearly move the substrate. A temperature of the lift is variable.

9 Claims, 9 Drawing Sheets

(56) References Cited

U.S. PATENT DOCUMENTS

2010/0322754 A1* 12/2010 Lee ...................... C23C 16/042
  414/749.6
2013/0272686 A1* 10/2013 Okada ............... H01L 21/67103
  392/418

FOREIGN PATENT DOCUMENTS

KR    1020080053587 A    6/2008
WO    WO2012174550    * 12/2012    ............. H01L 51/56

\* cited by examiner

PLASMA-ENHANCED CHEMICAL VAPOR DEPOSITION APPARATUS AND METHOD OF MANUFACTURING DISPLAY APPARATUS USING THE SAME

This application claims priority to Korean Patent Application No. 10-2013-0085694, filed on Jul. 19, 2013, and all the benefits accruing therefrom under 35 U.S.C. §119, the disclosure of which is incorporated herein in its entirety by reference.

BACKGROUND

1. Field

One or more exemplary embodiment of the invention relates to an apparatus and method, and more particularly, to a plasma-enhanced chemical vapor deposition ("PECVD") apparatus and a method of manufacturing a display apparatus by using the PECVD apparatus.

2. Description of the Related Art

Semiconductor devices, display apparatuses and other electronic devices generally include a plurality of thin layers that may be formed using various methods. One of these methods is a vapor deposition method.

In the vapor deposition method, at least one type of gas is used for forming a thin layer. Examples of the vapor deposition method include a chemical vapor deposition ("CVD") method, an atomic layer deposition ("ALD") method, and other various methods.

Among the display apparatuses, an organic light emitting display apparatus has a wide viewing angle, excellent contrast ratio and high response speed, and thus, has been regarded as a next-generation display apparatus.

The organic light emitting display apparatus includes an intermediate layer between a first electrode and a second electrode facing each other, and the intermediate layer includes an organic emissive layer. The organic light emitting display apparatus also includes one or more various thin layers that may be formed by using a deposition method.

However, where the size and resolution of the organic light emitting display apparatus is increased, depositing a relatively large-sized thin layer with desired characteristics is difficult. Also, improving efficiency of processes for forming the thin layer is difficult. Therefore, there remains a need for an improved process for forming a relatively large-sized thin layer, with improved efficiencies.

SUMMARY

One or more exemplary embodiment of the invention includes a plasma-enhanced chemical vapor deposition ("PECVD") apparatus which reduces or effectively prevents formation of a deposition material on a surface of components of the PECVD apparatus when forming a deposition layer on a substrate, and a method of manufacturing a display apparatus by using the PECVD apparatus.

Additional features will be set forth in part in the description which follows and, in part, will be apparent from the description, or may be learned by practice of the presented embodiments.

According to an exemplary embodiment of the invention, a PECVD apparatus includes: an ejecting unit which is configured to eject a gas toward a substrate onto which the gas is deposited; a lift which is configured to support and selectively raise or lower a mask unit in which is defined a pattern through which the gas ejected from the ejecting unit passes towards the substrate; and a susceptor into which a portion of the lift is inserted, and which is configured to linearly move the substrate. A temperature of the lift is variable.

The lift and the susceptor may move relative to each other.

The lift may include: a ball which contacts the mask unit; a shaft into which at least a portion of the ball is inserted, where the shaft is configured to move the ball linearly; and a heater unit coupled to at least one of the ball and the shaft.

The heater unit may include: a ball heater coupled to the ball; a shaft heater coupled to the shaft; and a power supply unit which is connected to the ball heater and the shaft heater, and supplies power thereto.

The power supply unit may include a first wiring unit connected to an external power supply unit and the shaft heater.

The power supply unit may include: a second wiring unit connected to an external power supply unit; a first connector coupled to an inner surface of the shaft and electrically connected to the second wiring unit; a second connector coupled to the first connector; and a third wiring unit electrically connected to the second connector and the ball heater.

The ball may include a ceramic material.

The PECVD apparatus may further include a plurality of lifts, where a first pair of the plurality of the lifts is movable in at least one of a first direction, a second direction perpendicular to the first direction, and a third direction perpendicular to each of the first direction and the second direction.

A second pair of the plurality of lifts may be movable in the third direction.

The PECVD apparatus may further include a control unit which is configured to control a temperature of at least one of the lift and the susceptor.

According to another exemplary embodiment of the invention, a method of manufacturing a display apparatus, includes: loading a substrate into a chamber comprising a plasma generating area; supplying a gas to the chamber so that a radical is formed in the chamber as the gas passes through the plasma generating area; disposing a mask unit, which is selectively supported by a lift, between the plasma generating area and the substrate; and forming a deposition layer on the substrate by the radical. A temperature of a lift is varied while the deposition layer is formed on the substrate.

The deposition layer may include an insulating layer.

The method may further include aligning the substrate and the mask unit with respect to each other.

In the aligning the substrate and the mask unit, when it is determined that the substrate and the mask unit are misaligned, a portion of the mask unit may be moved in at least one of a first direction, a second direction perpendicular to the first direction, and a third direction perpendicular to each of the first direction and the second direction.

The method may further include disposing the substrate and the mask unit in contact with each other.

When the substrate and the mask unit contact each other, the substrate and an end of the lift each contact a lower surface of the mask unit.

The method may further include, after disposing the mask unit and the substrate in contact each other, the lift may move the mask unit toward the plasma generating unit at a speed that is equal to a speed at which the substrate moves towards the plasma generating unit.

The lift may include: a ball which contacts the mask unit; a shaft into which at least a portion of the ball is inserted, where the shaft is configured to linearly move the ball; and a heater unit coupled to at least one of the ball and the shaft.

The heater unit may adjust temperatures of the ball and the shaft to be different from each other.

A temperature of the lift may increase while the deposition layer is formed on the substrate.

BRIEF DESCRIPTION OF THE DRAWINGS

These and/or other features will become apparent and more readily appreciated from the following description of the embodiments, taken in conjunction with the accompanying drawings of which.

DETAILED DESCRIPTION

Figure 1:
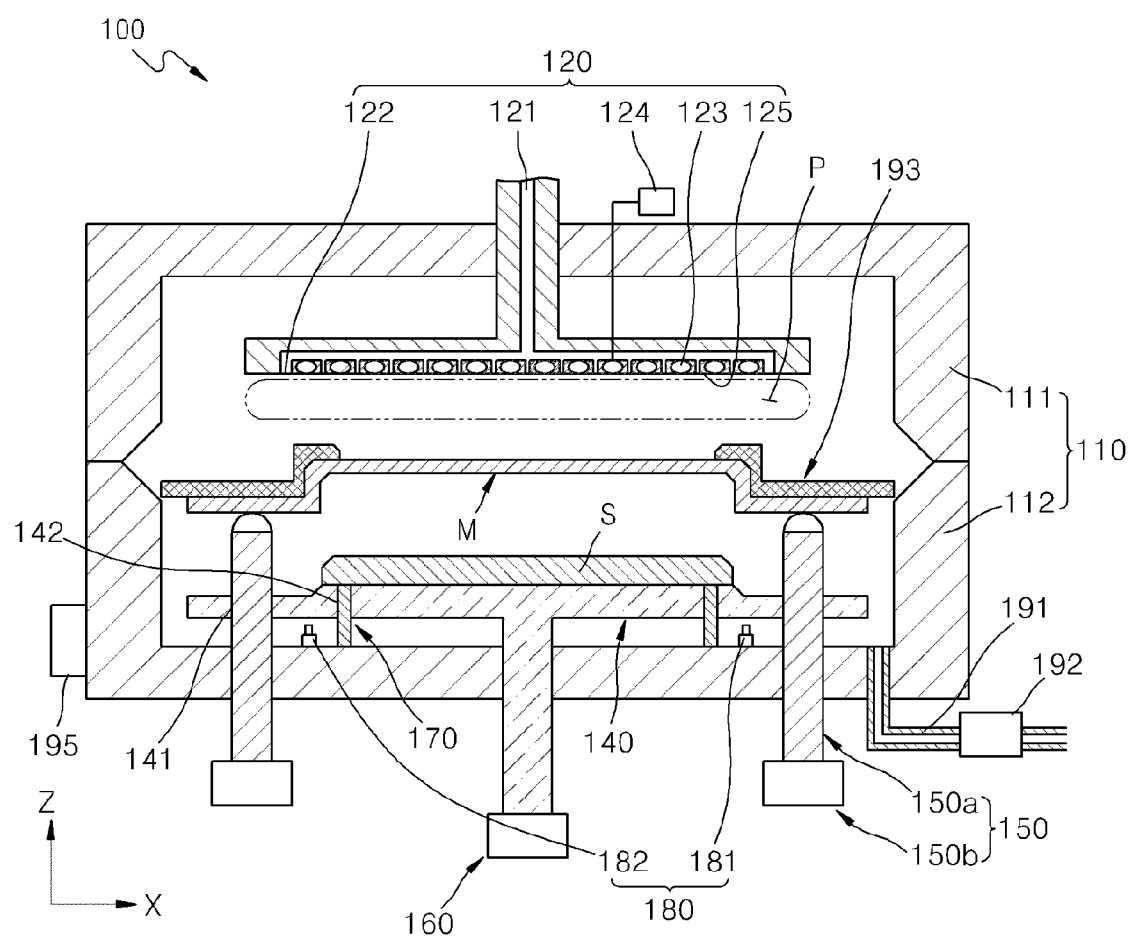
FIG. 1 is a cross-sectional view illustrating an exemplary embodiment of a plasma-enhanced chemical vapor deposition ("PECVD") apparatus according to the invention.

The invention will be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the invention to one of ordinary skill in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being fluidly, physically and/or electrically connected to each other. Like numbers refer to like elements throughout. As used herein, the term "and/or" includes any and all combinations of one or more of the associated listed items.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limited by the exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that, although the terms first, second, etc. may be used herein to describe various elements, these elements should not be limited by these terms. These terms are only used to distinguish one element from another.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a cross-sectional view illustrating an exemplary embodiment of a plasma-enhanced chemical vapor deposition ("PECVD") apparatus 100 according to the invention.

Referring to FIG. 1, the PECVD apparatus 100 may include a chamber 110. The chamber 110 may be configured to be in a vacuum state or an atmospheric pressure state according to a process performed therein. In detail, the chamber 110 is in a vacuum state when deposition is performed therein. Also, the chamber 110 is in an atmospheric pressure state when a substrate S is loaded therein or unloaded therefrom.

The chamber 110 may include a first housing 111, and a second housing 112 that is coupled to the first housing 111. The first housing 111 and the second housing 112 may be coupled to each other using, for example, a bolt, a screw, a clamp, a flange or a ring. Also, an opening portion (not shown) through which the substrate S is loaded into or unloaded from the PECVD apparatus 100 may be defined in at least one of the first and second housings 111 and 112, and a door (not shown) that exposes or blocks the opening portion may be included in the PECVD apparatus 100. Also, the substrate S may be loaded or unloaded after the first housing 111 and the second housing 112 are separated from each other. However, for convenience of description, the description below will focus on an exemplary embodiment in which the substrate S is loaded or unloaded through the opening portion defined in the first and/or second housing 111 and 112 of the PECVD apparatus 100.

The PECVD apparatus 100 may include an ejecting unit 120 that is configured to supply a first gas and a second gas into the chamber 110. A portion of the ejecting unit 120 may be fixed and extend through a wall of the chamber 110 such that a terminal end portion of the ejecting unit 120 is disposed within the chamber 110. A gas flowing unit 121 that is configured to allow the first gas and second gas to flow in the chamber 110 may be included in the ejecting unit 120. The gas flowing unit 121 may pass through the ejecting unit 120 and define a continuous flow path, and may be connected to an external gas supply unit (not shown).

Also, the ejecting unit 120 may include a gas ejecting portion 122 that is fluidly connected to the gas flowing unit 121 and on a surface of the ejection unit 120. The gas ejecting portion 122 is configured to eject the first gas or the second gas that flows through the gas flowing unit 121, into the chamber 110. The ejecting unit 120 may also include a plurality of gas ejecting portions 122, which are spaced apart from one another. The gas ejecting portions 122 may be openings defined in a terminal surface of the ejecting unit 120, which expose the gas flowing unit 121 flow path to an inside of the chamber 110.

A plasma generating area P may be defined in the chamber 110 and adjacent to the terminal surface of the ejecting unit, by operation of the ejecting unit 120. The ejecting unit 120 may further include a coil portion 123 and a power portion 124 in order to generate plasma by using the first gas. In detail, the coil portion 123 may be disposed at the terminal surface of the ejecting unit 120 and be connected to the power portion 124. The power portion 124 may apply radio frequency ("RF") power to the coil portion 123. The coil portion 123, which is a type of an induction coil, may convert the first gas into plasma under the RF power from the power portion 124.

In detail, the coil portion 123 may generate plasma by using the first gas that is supplied through the gas ejecting portion 122, and excite the second gas supplied through the gas ejecting portion 122 to reach a plasma state by using the already generated plasma from the first gas. Also, the coil portion 123 may excite the second gas supplied through the gas ejecting portion 122 to reach a plasma state. However, for convenience of description, the description below will focus on an exemplary embodiment in which plasma is generated by using the first gas, and then the second gas is excited to reach a plasma state by using the already generated plasma using the first gas.

The ejecting unit 120 may further include a cover portion 125 that is installed on the coil portion 123. The cover portion 125 may include an insulating material, and may reduce or effectively prevent damage to the coil portion 123 due to, for example, plasma. The cover portion 125 may be disposed not to overlap with the gas ejecting portion 122. That is, the cover portion 125 exposes the gas ejecting portion 122, and the openings which define the gas ejecting portion 122 may be considered to extend through a thickness of the cover portion 125. Along the terminal surface of the ejecting unit, the plurality of gas ejecting portions 122 and a plurality of cover portions 125 may alternate.

The PECVD apparatus 100 may include a lifting unit 150 that is configured to align and selectively move a mask unit M. The lifting unit 150 may include at least one lift 150a, and a lift driving unit 150b that is configured to drive the at least one lift 150a. The lifting unit 150 will be described in detail below with reference to FIGS. 2 and 3.

The PECVD apparatus 100 may include a susceptor 140 that is configured to linearly move the substrate S. The substrate S may be mounted on the susceptor 140 and be supported by the susceptor 140. Also, the susceptor 140 may include a heater (not shown) which is configured to adjust a temperature of the substrate S.

A lift insertion hole 141 is defined in the susceptor 140, through which the at least one lift 150a to be described later is inserted. A support pin insertion hole 142 is defined in the susceptor 140, through which a support pin 170 which is to be described later is inserted. Also, a fixing unit (not shown) may be on the susceptor 140 to fix the substrate S to the susceptor 140 after the substrate S is mounted thereon. The fixing unit may be, for example, a clamp, a pressurizing unit, an adhesive material or other various types of units.

The PECVD apparatus 100 may include a susceptor driving unit 160 that is connected to the susceptor 140 and configured to move the susceptor 140 linearly. The susceptor driving unit 160 may include a motor (not shown), a gear unit (not shown) connected to the motor, or a cylinder (not shown) with a variable length. However, any of a number of devices or structures that is configured to linearly move the susceptor 140 may be used. For convenience of description, the description below will focus on an exemplary embodiment in which the susceptor driving unit 160 includes the cylinder.

The PECVD apparatus 100 may include the support pin 170 that is configured to temporarily support the substrate S. The support pin 170 may be fixed on an inner surface of the chamber 110. Also, a plurality of support pins 170 may be included in the PECVD apparatus 100, and the plurality of support pins 170 may be spaced apart from one another to support the substrate S at a plurality of positions.

The PECVD apparatus 100 may include a vent pipe 191 connected to the chamber 110, and an exhaust pump 192 coupled to the vent pipe 191. The exhaust pump 192 may be configured to maintain the chamber 110 in a vacuum state. Also, the exhaust pump 192 may be configured to discharge gases that are generated during a vapor deposition operation and are unnecessary, to outside the chamber 110 and/or the PECVD apparatus 100.

The PECVD apparatus 100 may include a shadow frame 193 coupled to the mask unit M. The shadow frame 193 may surround a boundary of the mask unit M, such as in a plan view. The shadow frame 193 may reduce or effectively prevent injection of the second gas to the boundary of the mask unit M and deposition on the boundary of the mask unit M.

The PECVD apparatus 100 may include a control unit 195 that is configured to control a temperature of at least one of the lift 150a and the susceptor 140. The control unit 195 may be embodied in various forms. In one exemplary embodiment, for example, the control unit 195 may include various electronic devices such as a personal computer, a laptop computer, a typical control circuit or a portable electronic device. The control unit 195 is not limited thereto, and may include any device that is configured to control the PECVD apparatus 100.

The PECVD apparatus 100 may include an aligning unit 180 that is configured to measure positions of the mask unit M and the substrate S, such as with respect to each other. The aligning unit 180 may include a camera (not shown) that is configured to photograph an aligning mark of the mask unit M and an aligning mark of the substrate S. In particular, the aligning unit 180 may include a first camera 181, a second camera 182, a third camera (not shown) and a fourth camera (not shown). However, the aligning unit 180 is not limited thereto, any of a number of devices that is configured to measure the positions of the mask unit M and the substrate S may be used.

Images of the aligning mark of the mask unit M and the aligning mark of the substrate S that are photographed as described above may be transmitted to the control unit 195. The control unit 195 may determine whether the mask unit M and the substrate S are aligned or not (e.g., an alignment state) based on images of the aligning mark of the mask unit M and the aligning mark of the substrate S, and control the lifting unit 150 to align the mask unit M and the substrate S. A method of aligning the mask unit M and the substrate S by using the aligning unit 180 is the same or similar as a method of aligning the mask unit M and the substrate S by using a typical camera, and thus, a detailed description thereof will be omitted for convenience of explanation.

Hereinafter, the lifting unit 150 will be described in detail.

Figure 2:
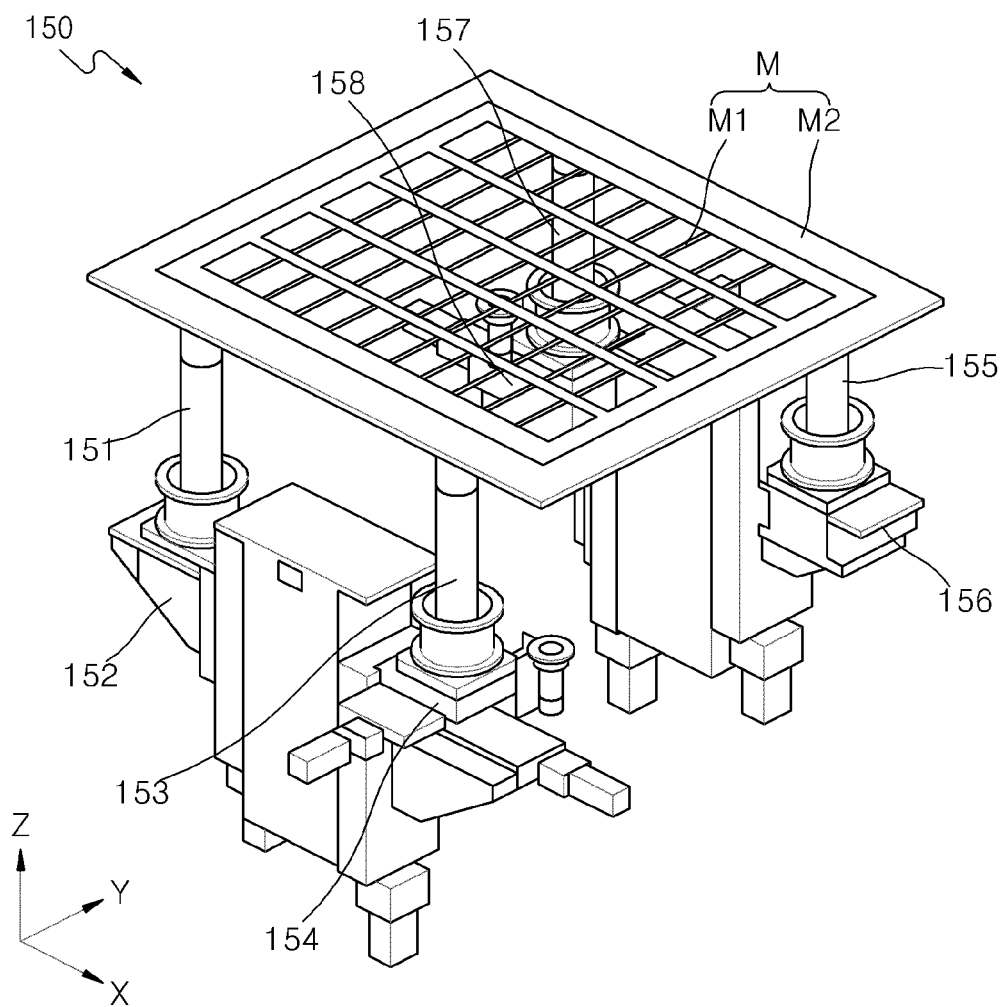
FIG. 2 is a perspective view illustrating an exemplary embodiment of a lifting unit illustrated in FIG. 1 according to the invention.
Figure 3:
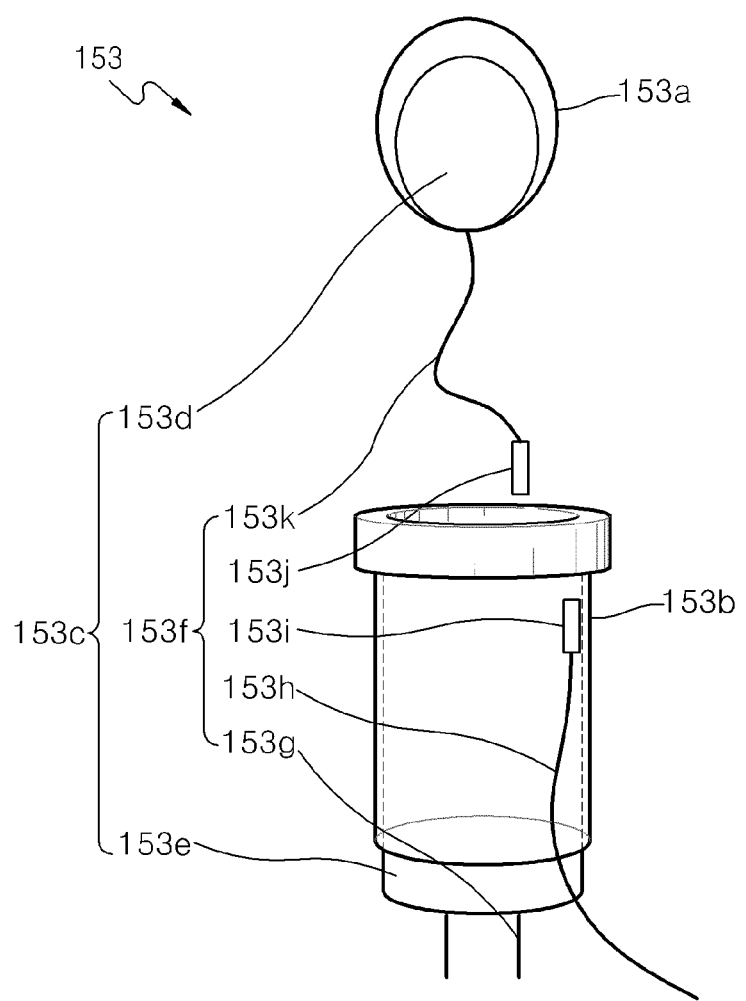
FIG. 3 is an exploded view illustrating an exemplary embodiment of a second lift illustrated in FIG. 2 according to the invention.

FIG. 2 is a perspective view illustrating an exemplary embodiment of the lifting unit 150 of FIG. 1 according to the invention. FIG. 3 is an exploded view illustrating an exemplary embodiment of a second lift 153 illustrated in FIG. 2 according to the invention.

Referring to FIGS. 2 and 3, the lifting unit 150 may include at least one lift (refer to FIG. 1) and at least one lift driving unit (refer to FIG. 1) that moves the at least one lift as described above. Hereinafter, for convenience of description, the description below will focus on an embodiment in which four lifts and four lift driving units are included.

The lifting unit 150 may include a first lift 151, a second lift 153, a third lift 155 and a fourth lift 157. The lifting unit 150 may also include a first lift driving unit 152 that is configured to move the first lift 151, a second lift driving unit 154 that is configured to move the second lift 153, a third lift driving unit 156 that is configured to move the third lift 155, and a fourth lift driving unit 158 that is configured to move the fourth lift 157.

The first through fourth lift driving units 152 through 158 may operate in similar manners. In particular, the first through fourth lift driving units 152 through 158 may respectively move the first through fourth lifts 151 through 157 in pairs. That is, a pair of the lifts may be moved at substantially a same time by the respective lift driving units.

In detail, the first lift driving unit 152 and the third lift driving unit 156 may be configured to move the first lift 151 and the third lift 155 as a pair, in a third direction, respectively. The third direction may be a Z-axis direction in FIG. 3.

Also, the second lift driving unit 154 and the fourth lift driving unit 158 may be configured to move the second lift 153 and the fourth lift 157 as a pair, in at least one of first, second and the third directions. The first direction and the second direction are perpendicular to each other, and the third direction may be perpendicular to the first direction and the second direction. In detail, the first direction is an X-direction in FIG. 2, and the second direction is a Y-direction in FIG. 2, and the third direction may be the Z-direction in FIG. 2 as described above. The first through third directions as described above are exemplary and may also be other various directions.

The first through fourth lifts 151 through 157 may be configured in the same or similar forms. In detail, the first lift 151 and the third lift 155 may be configured in the same form, and the second lift 153 and the fourth lift 157 may be configured in the same form. Hereinafter, the description will focus on the first lift 151 and the second lift 153 for convenience of description. In detail, the description will focus on the second lift 153.

The second lift 153 may include a second ball 153a that contacts the mask unit M. The second ball 153a may include a corrosion-resistant material. In one exemplary embodiment, for example, the second ball 153a may include a ceramic material. The second ball 153a as described above may be rotatably installed on a second shaft 153b which will be described later.

Also, the second lift 153 may include the second shaft 153b into which at least a portion of the second ball 153a is inserted, and the second shaft 153b is configured to move the second ball 153a linearly. As illustrated in FIG. 1, where a portion of the ball is inserted into the shaft, another portion of the ball protrudes from the shaft and contacts the mask unit M. The second shaft 153b may be connected to the second lift driving unit 154 and may linearly move according to motion of the second lift driving unit 154. In detail, the second shaft 153b may be configured to linearly move in at least one of the first through third directions according to motion of the second lift driving unit 154.

The second lift 153 may include a second heater unit 153c that is in at least one of the second ball 153a and the second shaft 153b. The second heater unit 153c may adjust a surface temperature of at least one of the second ball 153a and the second shaft 153b according to an external signal.

The second heater unit 153c may include a second ball heater 153d installed in the second ball 153a and a second shaft heater 153e installed in the second shaft 153b. Also, the second heater unit 153c may include a second power supply unit 153f that is connected to the second ball heater 153d and the second shaft heater 153e, and supplies power thereto.

The second power supply unit 153f may include a first wiring unit 153g that is connected to an external power source (not shown) and the second shaft heater 153e. Also, the second power supply unit 153f may include a second wiring unit 153h that is connected to the external power source and a first connector 153i. The first connector 153i is installed on an inner surface of the second shaft 153b and is electrically connected to the second wiring unit 153h. Also, the second power supply unit 153f may include a second connector 153j that is detachably coupled to the first connector 153i, and a third wiring unit 153k that is electrically connected to the second connector 153j and the second ball heater 153d.

The first lift 151 may also be configured in a similar manner as the second lift 153 described above. In detail, the first lift 151 may include a first ball (not shown), a first shaft (not shown) and a first power supply unit (not shown). The first shaft and the first power supply unit are the same or similar as the second shaft 153b and the second power supply unit 153f described above, and thus, a detailed description thereof will be omitted.

The first ball of the first lift 151 may be configured in a similar manner as the second ball 153a of the second lift 153. However, differently from the second ball 153a, the first ball of the first lift 151 may be fixedly (e.g., immovably) installed on the first shaft. That is, even when the first shaft moves, the first ball may support the mask unit M without moving.

As described above, the third lift 155 may be configured in the same manner as the first lift 151, and the fourth lift 157 may be configured in the same manner as the second lift 153.

In detail, the lifting unit 150 that is configured as described above may support the mask unit M. The mask unit M may include a fixed frame M2 that supports the mask slit M1. A mask slit M1 having a pattern is defined in the mask unit M. A surface of the substrate S disposed under the mask unit M may be exposed by the mask slit M1.

The mask unit M may be loaded into a chamber (refer to FIG. 1) to be mounted on the lifting unit 150. In one exemplary embodiment, the mask unit M may be mounted on the lifting unit 150 by using a robot arm that is installed in the chamber or outside the chamber.

The mask unit M mounted on the lifting unit 150 as described above may be aligned with the substrate S during a deposition operation. The mask unit M may be aligned with the substrate S by moving at least one of the first through fourth lifts 151 through 157.

In detail, the first through fourth lifts 151 through 157 may move in the third direction to adjust a height of the mask unit M within the chamber. Also, the second lift 153 and the fourth lift 157 may be moved in at least one of the first direction and the second direction to rotate the mask unit M or to modify a position of the mask unit M in a plane defined by the first and second directions.

The second ball 153a of the second lift 153 and a fourth ball (not shown) of the fourth lift 157 may rotate to assist movement of the mask unit M. Also, the first ball of the first lift 151 and a third ball (not shown) of the third lift 155 may not rotate to thereby reduce or effectively prevent separation of the mask unit M from the lifting unit 150.

Also, besides the operation of the lifting unit 150 described above, when a position of the mask unit M is to be modified, the above operation may be repeated to modify the position of the mask unit M.

A method of operating the PECVD apparatus 100 will be described in detail.

Figure 4:
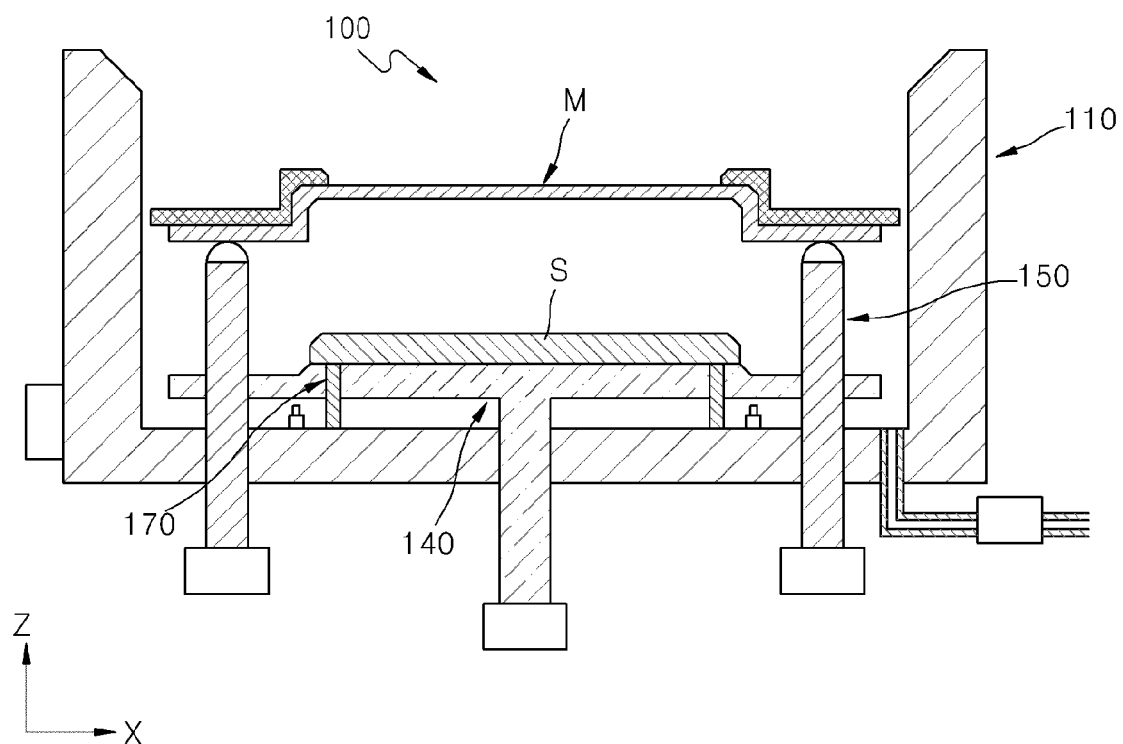
FIG. 4 is a cross-sectional view illustrating an exemplary embodiment of a first operation of the PECVD apparatus illustrated in FIG. 1 according to the invention.

FIG. 4 is a cross-sectional view illustrating an exemplary embodiment of a first operation of the PECVD apparatus 100 illustrated in FIG. 1 according to the invention.

Referring to FIG. 4, when the PECVD apparatus 100 operates, the lifting unit 150 may be disposed at an uppermost portion of the chamber 110. Moreover, the susceptor 140 may be disposed in a lowermost portion of the chamber 110. That is, the lifting unit 150 and the susceptor 140 may be positioned with a maximum distance therebetween.

When the susceptor 140 and the lifting unit 150 are disposed as described above, the substrate S may be loaded into the chamber 110. The substrate S may be moved from outside the chamber 110 into the chamber 110, such as via a robot arm as described above, and may be supported by a support pin 170 while disposed inside the chamber 110. Since the susceptor 140 is disposed in the lowermost portion of the chamber 110, the susceptor 140 including the substrate S thereon may be raised so that an upper end of the support pin 170 and an upper surface of the susceptor 140 correspond to each other.

When the substrate S is disposed as described above, the mask unit M and the substrate S may be spaced apart from each other. A space may exist between the substrate S and the mask unit M when the mask unit M and the substrate S are spaced apart from each other.

Figure 5:
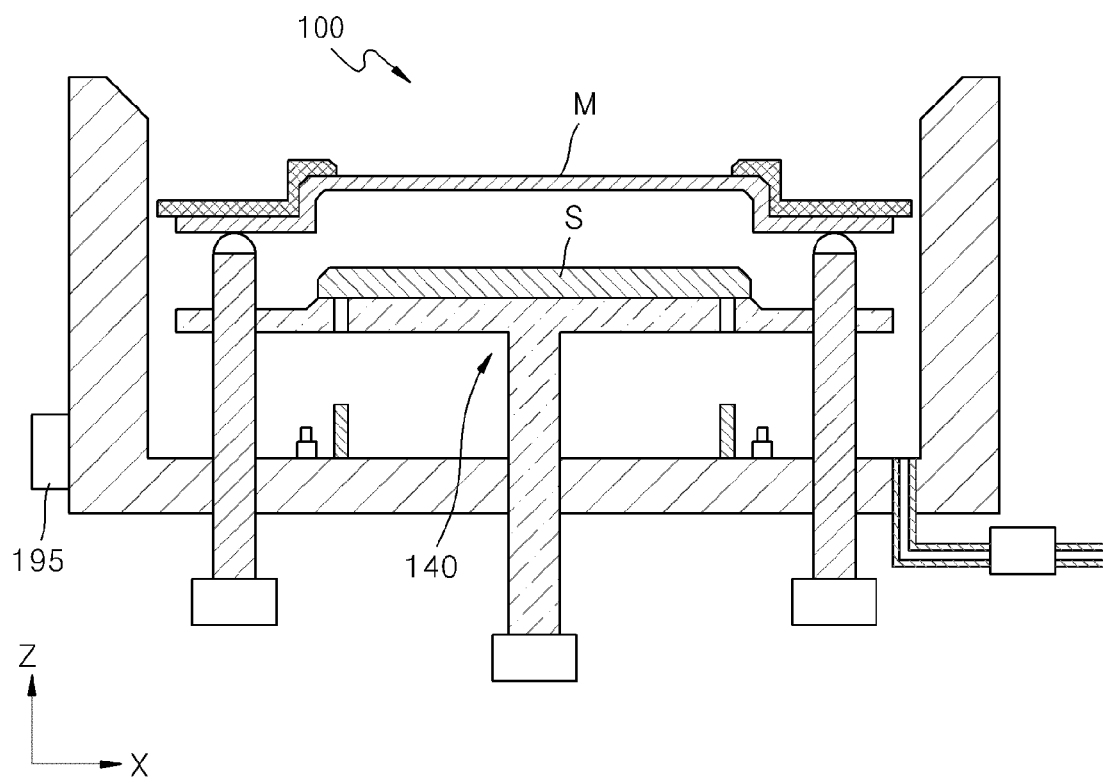
FIG. 5 is a cross-sectional view illustrating an exemplary embodiment of a second operation of the PECVD apparatus illustrated in FIG. 1 according to the invention.

FIG. 5 is a cross-sectional view illustrating an exemplary embodiment of a second operation of the PECVD apparatus 100 illustrated in FIG. 1 according to the invention.

Referring to FIG. 5, after the substrate S is completely loaded in the chamber 110, the susceptor 140 is raised by a predetermined distance so as to narrow a distance between the mask unit M and the substrate S. The susceptor 140 may be raised so that the distance between the substrate S and the mask unit M is less than that in FIG. 4. The control unit 195 may control the susceptor driving unit 160 based on a preset position of the susceptor 140.

Figure 6:
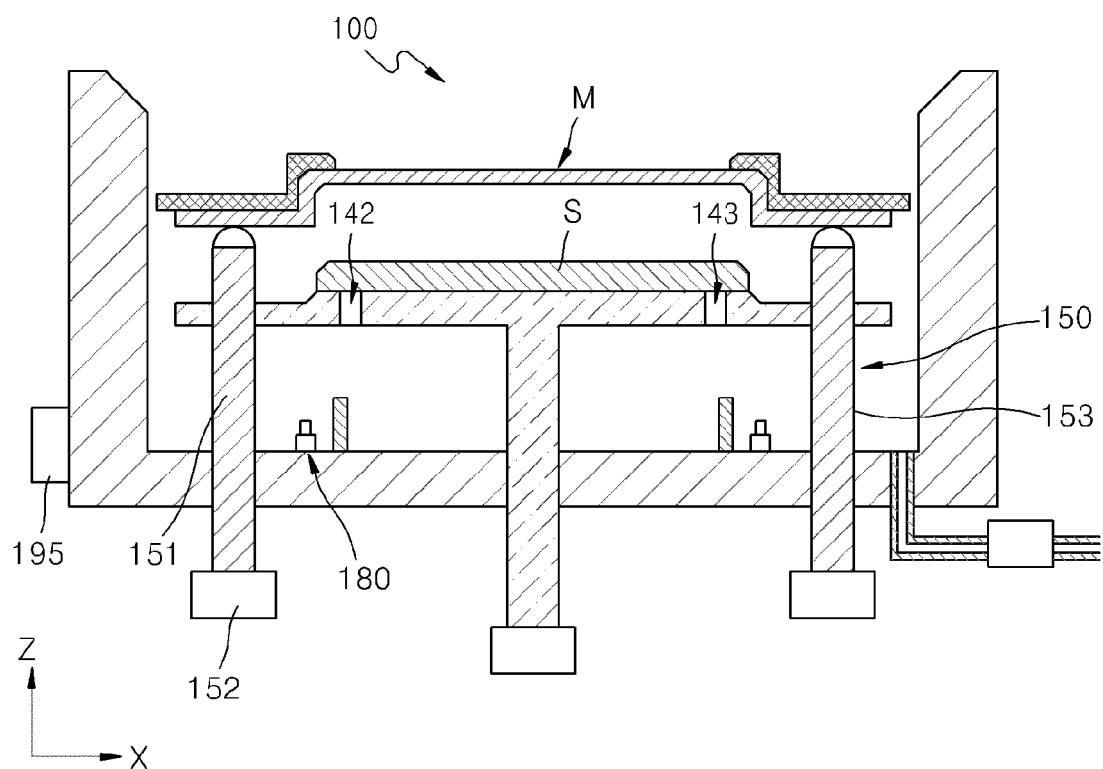
FIG. 6 is a cross-sectional view illustrating an exemplary embodiment of a third operation of the PECVD apparatus illustrated in FIG. 1 according to the invention.

FIG. 6 is a cross-sectional view illustrating an exemplary embodiment of a third operation of the PECVD apparatus 100 illustrated in FIG. 1 according to the invention.

Referring to FIG. 6, after the mask unit M and the substrate S are located as described above, the mask unit M and the substrate S may be aligned. The mask unit M and the substrate S may be aligned by photographing an aligning mark of the mask unit M and an aligning mark of the substrate S, and moving the mask unit M as the control unit 195 controls the lifting unit 150 such that the aligning mark of the mask unit M corresponds to the aligning mark of the substrate S.

In detail, the aligning unit 180 may photograph an aligning mark of the mask unit M and an aligning mark of the substrate S and transmit images of the same to the control unit 195. When the aligning mark of the mask unit M and the aligning mark of the substrate S are not aligned with each other, the control unit 195 may move the mask unit M in at least one of the first direction, the second direction and the third direction such that the aligning mark of the mask unit M corresponds to (e.g., is aligned with) the aligning mark of the substrate S, through operation of the lifting unit 150.

In a method of rotating the mask unit M, the mask unit M may be rotated or moved in at least one of the first direction and the second direction. Also, when a distance between the mask unit M and the substrate S is larger than a preset distance, the mask unit M may be moved in the third direction to achieve separation of the mask unit M and the substrate S by a preset distance.

Particularly, in the illustrated exemplary embodiment of the invention, to move the mask unit M in at least one of the first direction and the second direction, the second lift 153 and the fourth lift (not shown) may be operated and moved. Also, when moving the mask unit M in the third direction, the control unit 195 may control the first lift driving unit 152 through the fourth lift driving units (not shown) in order to simultaneously operate and move the first lift 151 through the fourth lift.

Figure 7:
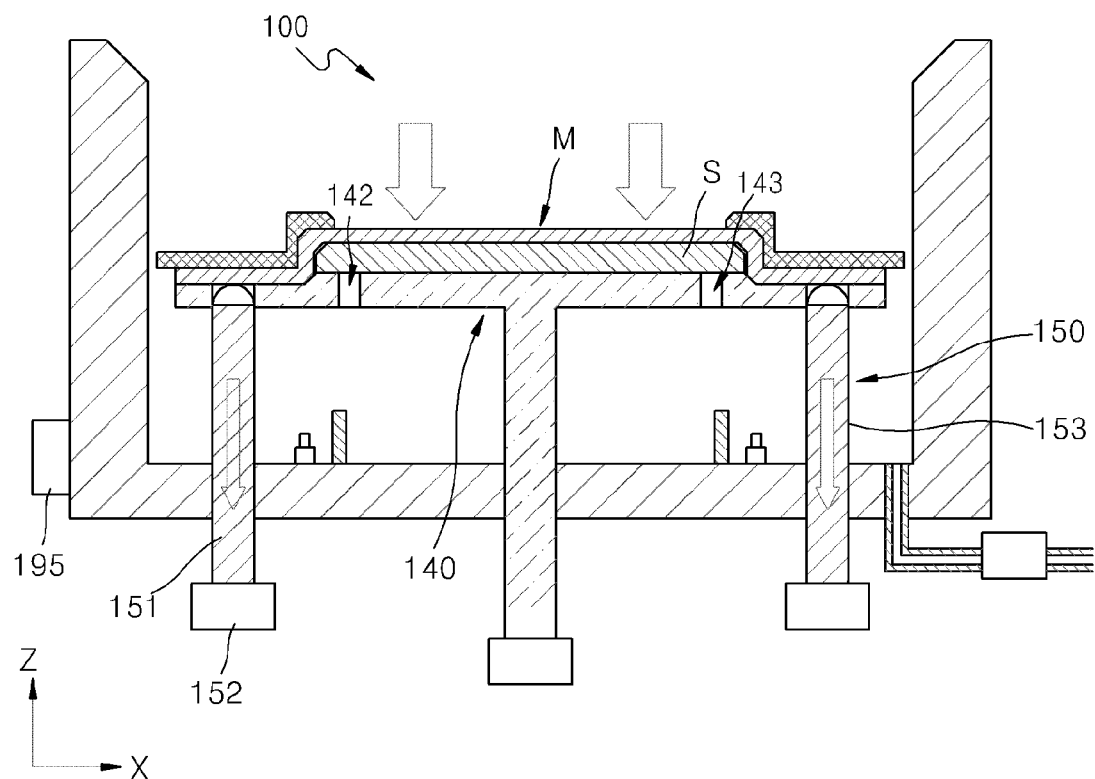
FIG. 7 is a cross-sectional view illustrating an exemplary embodiment of a fourth operation of the PECVD apparatus illustrated in FIG. 1 according to the invention.

FIG. 7 is a cross-sectional view illustrating an exemplary embodiment of a fourth operation of the PECVD apparatus 100 illustrated in FIG. 1 according to the invention.

Referring to FIG. 7, after the mask unit M and the substrate S are completely aligned as described above, the control unit 195 may fix a height position of the susceptor 140 and control the lifting unit 150 to lower the mask unit M towards the susceptor 140 including the substrate S thereon, as indicated by the downward arrows. A portion of the susceptor 140 may contact a portion of the mask unit M, so as to allow the mask unit M and the substrate S to contact each other When the lifting unit 150 operates as described above, the first lift 151 through the fourth lift (not shown) may be maintained in contact with the mask unit M. In detail, when the lifting unit 150 operates, the first lift 151 through the fourth lift may be lowered to the positions illustrated in FIG. 7. The control unit 195 may control the first lift driving unit 152 through the fourth lift driving unit (not shown) until the first lift 151 through the fourth lift are lowered up to a position where a surface of the susceptor 140 and the mask unit M contact each other. In particular, a distance that the first lift 151 through the fourth lift is lowered may be preset in the control unit 195.

Figure 8:
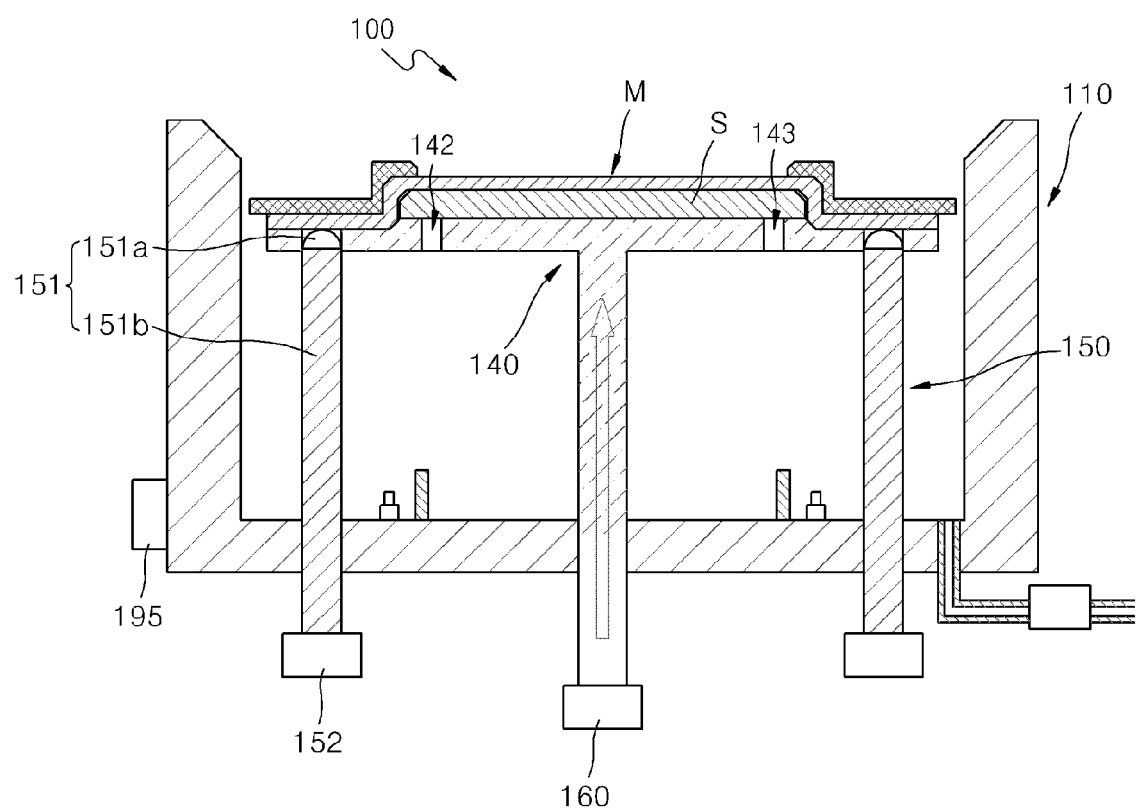
FIG. 8 is a cross-sectional view illustrating an exemplary embodiment of a fifth operation of the PECVD apparatus illustrated in FIG. 1 according to the invention.

FIG. 8 is a cross-sectional view illustrating an exemplary embodiment of a fifth operation of the PECVD apparatus 100 illustrated in FIG. 1 according to the invention.

Referring to FIG. 8, after the substrate S and the mask unit M contact each other, the control unit 195 operates the susceptor driving unit 160 to lift the susceptor 140 to be at a higher position in the chamber 110 than the susceptor 140 position illustrated in FIG. 7. The substrate S may be raised with the susceptor 140 since the substrate S is disposed on the susceptor 140. The mask unit M may be raised with the substrate S, for example, since the mask unit M is in contact with the substrate S.

While the above operation is performed, the control unit 195 may control the lifting unit 150 to raise the mask unit M. The control unit 195 may control the first lift driving unit 152 through the fourth lift driving unit (not shown) to raise the mask unit M in cooperation with the susceptor driving unit 160.

In detail, the control unit 195 may calculate a rising speed of the susceptor 140 and operate the first lift driving unit 152 through the fourth lift driving unit (not shown) such that the first lift 151 through the fourth lift (not shown) may raise at the same rising speed as the susceptor 140. The first ball 151a of the first lift 151 through the fourth ball (not shown) of the fourth lift may raise the mask unit M while remaining in contact with the mask unit M.

When the above operation is completed, after a first gas is supplied into the chamber 110, plasma may be formed around an ejecting unit (refer to FIG. 1), and then a second gas may be supplied through the ejecting unit to form a deposition layer on the substrate S. The second gas may form a radical while passing through an area where plasma is formed, and the radical may deposit on the substrate S to form the deposition layer.

While the above operation is performed, temperatures of the first lift 151 through the fourth lift may be varied. In detail, the temperatures of the first lift 151 through the fourth lift may be maintained to be approximately equal to an internal temperature of the chamber 110.

In one exemplary embodiment, for example, the control unit 195 may control an electrical current applied to a first ball heater (not shown) through a fourth ball heater (not shown) to maintain temperatures of the first ball 151a through the fourth ball to be approximately equal to the internal temperature of the chamber 110. Also, the control unit 195 may control an electrical current applied to a first shaft heater (not shown) through a fourth shaft heater (not shown) to maintain temperatures of a first shaft 151b through a fourth shaft (not shown) to be approximately equal to the internal temperature of the chamber 110. Also, while a deposition layer is formed on the substrate S as described above, the first lift 151 through the fourth lift may be maintained in contact with the mask unit M.

When a deposition operation as described above is completed, the susceptor 140 and the first lift 151 through the fourth lift may be lowered from respective positions thereof at which deposition is performed (e.g., a deposition position). Lowering of the first lift 151 through the fourth lift may stop after a predetermined distance from a deposition position of the lifts, such that the lifts are positioned at a stop position. The susceptor 140 may be lowered to a position lower than the stop positions of the first lift 151 through the fourth lift so as to dispose the substrate S separated from the mask unit M. In particular, the susceptor 140 and the first lift 151 through the fourth lift may move relative to each other to thereby dispose the mask unit M separated from the substrate S.

In addition, after being lowered a preset distance (e.g., the stop position), the susceptor 140 may be used to form an atmospheric pressure state inside the chamber 110 so that the substrate S on which a deposition layer has been formed may be unloaded to the outside of the chamber 110.

While the above operation is performed, a deposition layer may be formed on each of the first lift 151 through the fourth lift. In particular, when a deposition layer is formed on each of the first lift 151 through the fourth lift, deposition layers that are deposited on respective surfaces of the first lift 151 through the fourth lift may be separated therefrom due to the relative movement of the susceptor 140 and the first lift 151 through the fourth lift. The separated deposition layers may pollute the substrate S and/or the inside of the chamber 110 according to relative movement of the susceptor 140 and the first lift 151 through the fourth lift. In addition, after the first lift 151 through the fourth lift are separated from the mask unit M in a previous deposition operation, when the first lift 151 through the fourth lift come in contact again with the mask unit M in a subsequent deposition operation after the previous deposition operation is completed, the earlier formed deposition layer adsorbed on a surface of the mask unit M may be separated therefrom due to the repeated contact of the first lift 151 through the fourth lift, and may pollute the substrate S or the inside of the chamber 110.

According to one or more exemplary embodiment of the PECVD apparatus 100, by raising surface temperatures of the first lift 151 through the fourth lift as described above, formation of a deposition layer on the each surface of the first lift 151 through the fourth lift may be reduced or effectively prevented. Consequently, pollution of the substrate S and/or the inside of the chamber 110 is reduced or effectively prevented.

Moreover, according to one or more exemplary embodiment of the PECVD apparatus 100, deposition may be performed while maintaining the first lift 151 through the fourth lift in contact with the mask unit M. With the first lift 151 through the fourth lift in contact with the mask unit M, exposure of surfaces of the first lift 151 through the fourth lift is reduced such that deposition of a layer on those surfaces is reduced. Accordingly, when the substrate S and the mask unit M are finally separated, an amount of the deposition layer that is separated from the mask unit M due to movement of the first lift 151 through the fourth lift may be reduced.

Accordingly, one or more exemplary embodiment of the PECVD apparatus 100 may reduce particulates of the deposition layer generated in the deposition operation, thereby allowing the deposition operation to be performed in a precise and reliable manner. Moreover, one or more exemplary embodiment of the PECVD apparatus 100 may reduce or effectively prevent formation of a deposition layer on the surfaces of the first lift 151 through the fourth lift, thereby reducing the time and resources for cleaning the PECVD apparatus 100.

Figure 9:
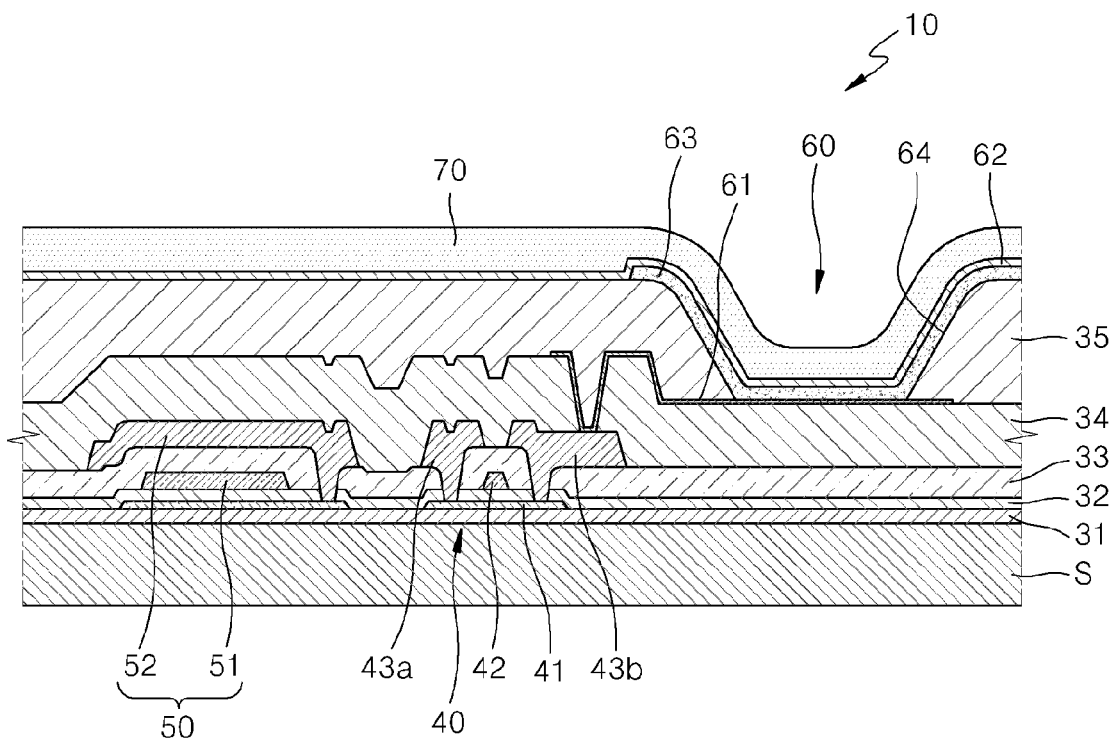
FIG. 9 is a schematic cross-sectional view illustrating an exemplary embodiment of a display apparatus manufactured by using the PECVD apparatus illustrated in FIG. 1 according to the invention.

FIG. 9 is a schematic cross-sectional view illustrating an exemplary embodiment of a display apparatus 10 manufactured by using the PECVD apparatus 100 illustrated in FIG. 1 according to the invention.

Referring to FIG. 9, the display apparatus 10 manufactured by using the PECVD apparatus 100 may be formed in various manners. In one exemplary embodiment, for example, the display apparatus 10 may be a liquid crystal display apparatus, a plasma display apparatus, an organic light emitting display apparatus or the like. For convenience of description, the description below will focus on an embodiment in which the display apparatus 10 is an organic light emitting display apparatus.

When manufacturing the display apparatus 10, the PECVD apparatus 100 may form a deposition layer on the substrate S. The deposition layer may include various insulation layers, but is not limited thereto. The deposition layer may include layers such as a buffer layer 31, a gate insulating layer 32, an interlayer insulation layer 33, a passivation layer 34 and a pixel defining layer 35 of the display apparatus 10, which will be described later.

Also, the deposition layer may be other various thin film layers such as an active layer 41, a gate electrode 42, a source electrode 43a, a drain electrode 43b, a first electrode 61, an intermediate layer 63 and a second electrode 62. However, for convenience of description, the description below will focus on an exemplary embodiment in which the deposition layer formed by using the PECVD apparatus 100 is an encapsulation layer 70, which will be described later.

Elements of the display apparatus 10 are disposed on the substrate S. The substrate S may include a glass material, a plastic material or a metal, but is not limited thereto. The buffer layer 31 that provides a planar surface on the substrate S and includes an insulation material for reducing or effectively preventing penetration of moisture and foreign substances, is disposed on the substrate S.

A thin film transistor ("TFT") 40, a capacitor 50 and an organic light emitting device 60 are disposed on the buffer layer 31. The TFT 40 includes the active layer 41, the gate electrode 42, the source electrode 43a and the drain electrode 43b. The organic light emitting device 60 includes the first electrode 61, the second electrode 62 and the intermediate layer 63.

In detail, the active layer 41 in a predetermined pattern is disposed on an upper surface of the buffer layer 31. The active layer 41 may include a semiconductor material having a p-type or n-type dopant. The active layer 41 including a semiconductor material as described above may include polysilicon, but is not limited thereto, and may also include a semiconductor oxide. In exemplary embodiments, for example, the semiconductor oxide may include a Group 12, 13, or 14 metal element such as zinc (Zn), indium (In), gallium (Ga), a tin (Sn), cadmium (Cd), germanium (Ga), or hafnium (Hf), and/or an oxide of a material selected from the combination of these materials. In one exemplary embodiment, for example, the active layer 41 may include $(In_2O_3)a(Ga_2O_3)b(ZnO)c$ (where a, b, and c are real numbers that respectively satisfy the conditions of $a \geq 0$, $b \geq 0$, and $c > 0$).

The gate insulating layer 32 is disposed on the active layer 41. The gate electrode 42 is disposed on the gate insulating layer 32 to correspond to the active layer 41. The interlayer insulating layer 33 is disposed to cover the gate electrode 42. The source electrode 43a and the drain electrode 43b are disposed on the interlayer insulating layer 33, and in contact with a predetermined area of the active layer 41. The passivation layer 34 may be disposed to cover the source electrode 43a and the drain electrode 43b, and an additional insulating layer (not shown) may be further disposed on the passivation layer 34 to planarize the TFT 40.

The first electrode 61 is disposed on the passivation layer 34. The first electrode 61 is electrically connected to the drain electrode 43. Also, the pixel defining layer 35 is formed to cover the first electrode 61. A predetermined opening 64 is defined in the pixel defining layer 35, and the intermediate layer 63 including an organic emissive layer is disposed in the opening 64. The second electrode 62 is disposed on the intermediate layer 63.

The organic emissive layer may include any one of various forms. In one exemplary embodiment, for example, the organic emissive layer may be discretely disposed inside the opening 64, and sub-pixels emitting red, green and blue light may form a single unit pixel. Also, the organic emissive layer may be commonly disposed over the entire pixel defining layer 35 regardless of positions of pixels. The organic emissive layer may include vertically stacked layers including light emitting materials that emit red, green or blue light or by combining light emitting materials emitting red, green and blue light. As long as the organic emissive layer may emit white light, combination of other colors is also possible. The display apparatus 10 may include a color converting layer (not shown) and/or a color filter (not shown) that is configured to convert white light to a predetermined color.

The encapsulation layer 70 is disposed on the second electrode 62. The encapsulation layer 70 may include at least one organic layer and at least one inorganic layer which are alternately stacked.

A plurality of inorganic layers and a plurality of organic layers may be included in the encapsulation layer 70.

The organic layer of the encapsulation layer 70 may include a polymer, and may be a single layer structure or a multi-layer structure. The organic layer may include one of polyethylene terephthalate, polyimide, polycarbonate, epoxy, polyethylene, and polyacrylate. In detail, the organic layer includes a polymerized form of a monomer composition of a diacrylate-based monomer and a triacrylate-based monomer. The monomer composition may further include a monoacrylate-based monomer. Also, a photo-initiator may be further included in the monomer composition, but the invention is not limited thereto.

The inorganic layer of the encapsulation layer 70 may be a single layer structure or a multi-layer structure, including a metal oxide or a metal nitride. In detail, the inorganic layer may include one of $SiN_x$, $Al_2O_3$, $SiO_2$, and $TiO_2$.

An uppermost layer of the encapsulation layer 70 exposed to the outside may include the inorganic layer to reduce or effectively prevent penetration of moisture into the intermediate layer 63.

The encapsulation layer 70 may include at least one sandwich structure in which an organic layer is inserted between two inorganic layers. Also, the encapsulation layer 70 may include at least one sandwich structure in which an inorganic layer is inserted between two organic layers.

The encapsulation layer 70 may sequentially include a first inorganic layer, a first organic layer and a second inorganic layer, from an upper portion of the second electrode 62. Also, the encapsulation layer 70 may sequentially include a first inorganic layer, a first organic layer, a second inorganic layer, a second organic layer and a third inorganic layer, from the upper portion of the second electrode 62. Also, the encapsulation layer 70 may sequentially include from the upper portion of the second electrode 62, a first inorganic layer, a first organic layer, a second inorganic layer, a second organic layer, a third inorganic layer, a third organic layer and a fourth inorganic layer. However, the invention is not limited to the above-described configurations.

A halogenized metal layer including LiF may be further included between the second electrode 62 and the first inorganic layer of the encapsulation layer 70. The halogenized metal layer may reduce or effectively prevent damage to the second electrode 62, in a process of forming the first inorganic layer during manufacturing of the display apparatus 10.

The first organic layer of the encapsulation layer may have a smaller surface area than the second inorganic layer, and the second organic layer may have a smaller surface area than the third inorganic layer. Also, the first organic layer may be completely covered by the second inorganic layer, and the second organic layer may also be completely covered by the third inorganic layer.

In an exemplary embodiment of manufacturing the display apparatus 10, the encapsulation layer 70 may be formed by using one or more exemplary embodiment of the PECVD apparatus 100. That is, the encapsulation layer 70 may be formed by performing a vapor deposition operation while the substrate S including the second electrode 62 and underlying layers thereon, is mounted on the susceptor 40 of the PECVD apparatus 100.

Accordingly, when using the PECVD apparatus 100, insulating layers having a desired cross-sectional thickness and other conductive layers, particularly, insulating layers such as the encapsulation layer 70, that are thicker than an electrode, may be formed relatively quickly in the display apparatus 10.

As described above, according to the one or more exemplary embodiment of a PECVD apparatus of the invention, an amount of a deposition layer that is adsorbed on a lift during a deposition operation may be reduced, and separation of the deposition layer adsorbed on a mask unit may be reduced or effectively prevented, thereby reducing a defect ratio of a display apparatus formed in the PECVD apparatus.

It should be understood that the exemplary embodiments described herein should be considered in a descriptive sense only and not for purposes of limitation. Descriptions of features within each exemplary embodiment should typically be considered as available for other similar features in other exemplary embodiments.

While one or more exemplary embodiments of the invention has been described with reference to the figures, it will be understood by those of ordinary skill in the art that various changes in form and details may be made therein without departing from the spirit and scope of the invention as defined by the following claims.

What is claimed is:

1. A method of manufacturing a display apparatus, the method comprising:
    loading a substrate into a chamber comprising a plasma generating area;
    disposing a mask unit in the chamber, which is selectively supported by a lift in the chamber, between the plasma generating area and the substrate;
    supplying a gas to the chamber so that a radical is formed in the chamber as the gas passes through the plasma generating area; and
    forming a deposition layer on the substrate by the radical depositing on the substrate,
    wherein a heater united coupled to
    the lift supporting the mask unit in the chamber and between the plasma generating area and the substrate increases a temperature of the lift while the deposition layer is formed on the substrate.

2. The method of claim 1, wherein the deposition layer comprises an insulating layer.

3. The method of claim 1, further comprising aligning the substrate and the mask unit with respect to each other.

4. The method of claim 3, wherein in the aligning the substrate and the mask unit,
    when it is determined that the substrate and the mask unit are misaligned, a portion of the mask unit is moved in at least one of a first direction, a second direction perpendicular to the first direction, and a third direction perpendicular to each of the first direction and the second direction.

5. The method of claim 1, further comprising disposing the substrate and the mask unit in contact with each other.

6. The method of claim 5, wherein when the substrate and the mask unit contact each other, the substrate and an end of the lift each contact a lower surface of the mask unit.

7. The method of claim 5, further comprising, after disposing the mask unit and the substrate in contact each other, the lift moving the mask unit towards the plasma generating area at a speed equal to a speed at which the substrate moves towards the plasma generating area.

8. The method of claim 1, wherein the lift comprises:
    a ball which contacts the mask unit;
    a shaft into which at least a portion of the ball is inserted, wherein the shaft is configured to move the ball linearly; and
    the heater unit coupled to at least one of the ball and the shaft.

9. The method of claim 8, wherein the heater unit is configured to adjust temperatures of the ball and the shaft to be different from each other.

* * * * *